United States Patent [19]

Seppä

[11] Patent Number: 5,488,295
[45] Date of Patent: Jan. 30, 1996

[54] METHOD AND APPARATUS FOR CANCELLING NOISE OF A LOW-NOISE SENSOR

[75] Inventor: Heikki Seppä, Helsinki, Finland

[73] Assignee: Valtion Teknillinen Tutkimuskeskus, Espoo, Finland

[21] Appl. No.: 952,885
[22] PCT Filed: May 15, 1991
[86] PCT No.: PCT/FI91/00154
 § 371 Date: Nov. 12, 1992
 § 102(e) Date: Nov. 12, 1992
[87] PCT Pub. No.: WO91/18298
 PCT Pub. Date: Nov. 28, 1991

[30] Foreign Application Priority Data

May 15, 1990 [FI] Finland .................................. 902424

[51] Int. Cl.⁶ .................................................. G01R 33/035
[52] U.S. Cl. ............................................ 324/248; 505/846
[58] Field of Search ........................... 324/248; 505/846; 327/527

[56] References Cited

U.S. PATENT DOCUMENTS 4,663,590  5/1987  Gershenson et al. .
4,761,611  8/1988  Hoenig .
4,851,776  7/1989  Goto et al. .
4,906,930  3/1990  Nakane et al. ........................ 324/248

FOREIGN PATENT DOCUMENTS 3735668  5/1989  Germany .
8103710  12/1981  WIPO .

OTHER PUBLICATIONS

Drung et al., "Low-noise high speed dc superconducting quantum interference device magnetometer with simplified feedback eletronics", Appl. Phys. Lett. 57(4) 23 Jul. 1990 pp. 406–408.

Primary Examiner—Walter E. Snow
Attorney, Agent, or Firm—Merchant, Gould, Smith, Edell, Welter & Schmidt

[57] ABSTRACT

The invention relates to a method and apparatus for processing the output signal of a low-noise sensor, particularly a squid. According to the invention, the output signal is coupled back to the sensor input by means of a resistance is set to be suitable by adjusting the rate of the resistor from room temperature, for instance by means of voltage.

7 Claims, 6 Drawing Sheets

METHOD AND APPARATUS FOR CANCELLING NOISE OF A LOW-NOISE SENSOR

BACKGROUND OF THE INVENTION

The invention relates to a method for processing the output signal of a low-noise sensor, particularly a sensor based on one or several Josephson junctions, such as a SQUID.

The invention also relates to an apparatus for processing the output signal of a sensor based on one or several Josephson junctions, such as a SQUID.

The invention also relates to a multichannel magnetometer.

The invention also relates to an apparatus for measuring the strength and/or gradient of a magnetic field.

The method and apparatus of the invention are particularly related to processing output signals from SQUID sensors and generally from other sensors with corresponding electric properties.

The SQUID sensor, or SQUID (Superconducting Quantum Interference Device) is used for measuring weak magnetic fields. The output impedance of a SQUID is only about 1–5 Ω. Its operative temperature is typically 4.2° K., down to which temperature it is suitably cooled. The operative temperature depends on the superconducting material used in the SQUID, and is therefore as low as the superconductor needs in order to work. The noise in the output is very low; it is not much higher than the thermal noise of resistors used in attenuating Josephson junctions. The SQUID sensor is often used for measuring low-frequency signals within the range of 0.1 Hz–10 kHz.

A drawback in the sensors described above is that it is difficult to amplify the output signal without increasing noise. The reason for this is that the frequency fluctuation of the output signal is relatively small, about 10 uV–100 uV from peak to peak. Moreover, the noise of the SQUID in the output roughly corresponds to the thermal noise of resistors used in attenuating Josephson junctions. If the noise temperature of the amplifier following a SQUID with the temperature of 4.2° K. is below 10° K., the amplifier does not remarkably increase the incertainty in the measurement of the magnetic flux.

None of the ordinary dc-coupled amplifiers operated at room temperature have sufficiently low noise capacities when used directly with a SQUID sensor. This is due to the low output impedance of the SQUID, as well as to the fact that it is often used for measuring low-frequency signals within the area 0.1 Hz–10 kHz. Within the frequency range 1 kHz–100 kHz, the FET amplifiers have an extremely low noise temperature and therefore there is employed a flux modulator and a transformer functioning at low temperatures in connection with a dc SQUID sensor, in order to adjust the low impedance to the FET amplifier. When proceeding in this fashion, the uncertainty in the measurement of the magnetic flux is defined by the noise of the SQUID solely. Moreover, it can be proved both theoretically and empirically that when the noise from the SQUID is decreased, the magnetic flux-frequency modification grows, and consequently the requirements for the signal processing electronics are not increased.

However, problems arise when several SQUID sensors are coupled together to form multichannel devices. Among such devices, let us mention a multichannel magnetometer.

They have been lately manufactured for measuring weak magnetic fields of the brains and the heart. At present the goal is to accomplish a magnetometer with 30–120 channels. If such a multichannel magnetometer is realized by means of SQUID sensors, by utilizing flux modulation techniques, the expenses caused by the signal processing electronics grow remarkably, because for each SQUID and channel there is needed a cryogenic transformer, a preamplifier, a modulator etc. The electronics in this kind of a multichannel magnetometer become really complicated and costly.

It is known that by using positive feedback, the amplification of the amplifier is grown. However, this method has the risk that the amplifier becomes unstable and/or is drifted aside from its operating point.

In addition to this, in connection with positive feedback it is difficult to realize the signal processing device so that the noise of the sensor, such as a SQUID sensor, were not dependent on the noise of the next amplification level, too. The reason for this is that to arrange sufficient amplification means to make the device nearly unstable. If, on the other hand, the device is designed to be extremely stable, the strengthened amplification caused by positive feedback is not enough to ensure that the noise of the next amplification level should not affect the total noise.

SUMMARY OF THE INVENTION

The object of the invention is to eliminate the above described drawbacks, or at least remarkably alleviate their effects.

A particular object of the present invention is to introduce a method and apparatus for realizing positive feedback in adaptive form, so that a sufficient amplification is achieved without unstability.

When positive adaptive feedback is employed, the flux modulation technique is not necessarily needed. When it is left out, the temperature dependency of the critical currents of the Josephson junctions causes temperature dependency in the flux under measurement. The object of the present invention also is to introduce a method and apparatus for connecting adaptive positive feedback to the elimination of the flux noise created by the temperature dependency of the critical current.

Another object of the invention is to suggest various methods for providing negative feedback.

The method of the invention relates to processing the output signal of a low-noise sensor, particularly one or several sensors based on the Josephson junction, such as a SQUID. According to the invention, the output signal is coupled back to the sensor input by means of a resistor in order to create positive feedback; and the amplification is set to be suitable by adjusting the rate of the resistor.

The apparatus of the invention is characterized in that in between the output and input of the sensor, there is arranged an adjustable resistor in order to realize positive feedback, and that the rate of the said resistor is adjusted to be suitable in order to achieve the desired amplification.

In a preferred embodiment of the apparatus, the adjustable resistor is controlled from outside the sensor by means of voltage, current or light. Advantageously the adjustable resistor is a channel transistor, such as a GaAs JFET or MESFET.

In a preferred embodiment of the method, at the beginning of the measuring process, the amplified output signal is observed, and amplification is set on a suitable level by adjusting the rate of the resistor, whereafter the measurements proper are carried out.

In another preferred embodiment of the method, in the amplified output signal there is observed a noise signal located externally with respect to the measuring band, advantageously above it, and the rate of the resistor is adjusted according to this noise signal.

In another preferred embodiment of the apparatus, it comprises a detector for detecting the noise from above the measuring band, and a regulating unit for setting the resistor rate and thereby the amplification, so that the output noise corresponds to the predetermined rating.

In another preferred embodiment of the method, in the sensor there is fed an ac-current signal with a certain frequency, advantageously a sinusoidal signal, and the amplified output signal of this is observed, and the resistor rate is adjusted suitable on the basis thereof.

In another preferred embodiment of the apparatus, it comprises an oscillator coupled to the sensor outlet, and a detector for detecting the oscillator signal and a modulator for setting the resistor rate so that the amplified output signal from the oscillator corresponds to the predetermined rating.

In another preferred embodiment of the method, the amplified output signal is brought, through the regulating unit, back to the sensor input in order to create a negative countercoupling, and the final measurement is carried out from the feedback voltage.

In another preferred embodiment of the apparatus, the apparatus comprises a second regulating unit, wherethrough the amplified output signal is brought back to the sensor input in order to create negative feedback.

In another preferred embodiment of the method, the negative feedback is arranged so that it is effective only within the particular frequency zone where the measurments are performed.

In another preferred embodiment of the method, the negative feedback of the SQUID is arranged through an external magnetic field brought from room temperature, thereby neutralizing the magnetic field affecting the SQUID.

In another preferred embodiment of the apparatus, at room temperature, in the vicinity of the SQUID, there is provided a separate coil wherethrough the amplified output signal is coupled back to the SQUID input, in order to realize negative feedback and to neutralize the magnetic field.

In another preferred embodiment of the method, there is employed a pair of SQUIDs, the sum signal of the output voltages of these two SQUIDs is detected, and the negative countercoupling of the sum is arranged via the magnetic fields back to each SQUID; and the difference signal of the output voltages of the two SQUIDs is detected, and the negative countercoupling of the difference is arranged via the magnetic fields back to each SQUID; and the gradient of the magnetic field is comparable to the current, whereby the negative feedback of the sum signal is created, and where the strength of the magnetic field is comparable to the current, whereby the negative feedback of the difference signal is created.

In another preferred embodiment of the method, for processing the output signal from a sensor based on one or several Josephson junctions, such as a SQUID, in order to eliminate the flux noise created by the temperature dependence of the critical current of the Josephson junction, there is arranged a temperature-dependent resistor in the vicinity of the junction.

In another preferred embodiment of the method, for eliminating the flux noise from the critical current of the Josephson junction, a bias current and/or bias voltage is modulated at a high frequency, and the flux is simultaneously shifted for half of the length of the cycle.

The multichannel magnetometer of the invention comprises a number of separate magnetometers which are realized by means of SQUID sensors, these sensors being arranged in a cold space such as a dewar, and provided with a preamplifier and negative feedback. According to the invention, in the vicinity of each separate SQUID sensor, outside the cold space, there is arranged a coil which is connected at least to the outlet of the preamplifier of the corresponding SQUID, via which coil the feedback is realized for neutralizing the magnetic field affecting the SQUID.

According to the invention, the apparatus for measuring the strength and/or gradient of the magnetic field comprises two SQUIDs, their preamplifiers and separate coils provided at room temperature in the vicinity of the SQUIDs, the outlets of the said preamplifiers being connected, via the summing member and the first regulating unit, parallelly to the first coils of both SQUIDs, in order to create negative feedback for the sum signal, and the outlets of the said preamplifiers being connected, via the subtracting member and the second regulating unit, in opposite directions to the second coils of both SQUIDs, in order to create negative feedback for the difference signal; the gradient of the magnetic field in the said apparatus is comparable to the current whereby the negative feedback for the sum signal is created, and the strength of the magnetic field is comparable to the current whereby the negative feedback for the difference signal is created.

In another preferred embodiment of the apparatus, in order to compensate the deviations in the mutual inductances of the SQUIDs, the apparatus is provided with an electric corrective circuit which is connected in between the feedback circuits, so that a small part of the voltage comparable to the magnetic field is summed to the voltage comparable to the gradient of the magnetic field.

In another preferred embodiment of the apparatus, three pairs of SQUID sensors are coupled on opposite sides of an imaginary cube, for measuring the strength and/or gradient of the magnetic field in three spatial dimensions.

An advantage of the invention is that positive feedback can be effectively applied in connection with low-noise sensors for amplifying weak signals.

Another advantage of the invention is that positive feedback is realized in an adaptive fashion, so that the system remains stabile and in optimal state during the measurement.

Another advantage of the invention is that fewer parts of the apparatus are located at a low temperature than in the previous art. This helps cut maintenance and production costs.

Another advantage of the invention is that in addition to positive adaptive feedback, various negative feedback procedures can be made use of.

Yet another advantage of the invention is that the method allows for simplifying the processing device for the output signal of the sensor.

Owing to the invention, the complicated flux modulation technique can be given up, at least in the processing of the output signals from SQUID sensors.

Further, owing to the invention a new multichannel magnetometer can be realized more simply than before, in a relatively economical and reliable fashion.

Moreover, owing to the invention it is possible to realize a new apparatus for measuring the strength and/or gradient of the magnetic field, with high accuracy and flexible dynamics. Another advantage of this apparatus is that it can be used for measuring both the magnetic field and its gradient.

Yet another advantage of the invention is that on the basis of the method of the invention, there can be realized an extremely well balanced gradiometer, the electric tuning whereof is advantageously performed only once.

BRIEF DESCRIPTION OF THE DRAWINGS

In the following the invention and its advantages are explained in more detail with reference to the appended drawings, where.

DETAILED DESCRIPTION OF THE PREFERRED EMBODIMENT

Figure 1:
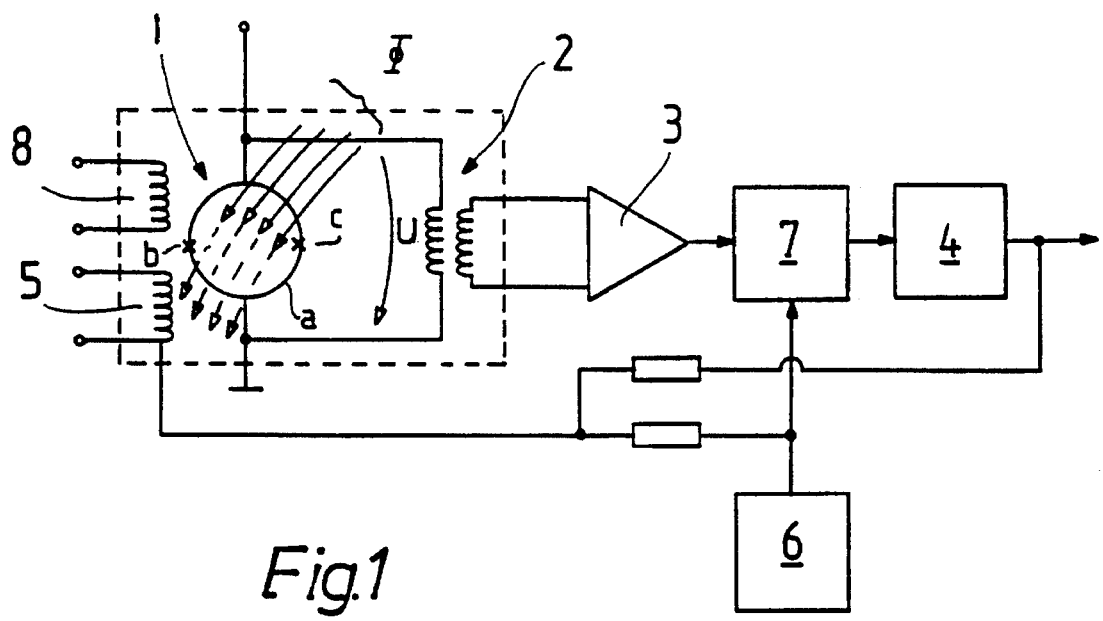
FIG. 1 is a schematical illustration of a SQUID sensor and the processing of the output signal in the prior art.

FIG. 1 represents a schematical illustration of a SQUID sensor 1 and an ordinary processor for the output signal. The apparatus comprises a transformer 2, by intermediation of which the sensor is fitted in a FET preamplifier 3. The outlet of the preamplifier is connected, via a demodulator 7 and regulating unit 4, to a flux modulation coil 5, where the modulator 6 also is connected. The output signal of the processing device is obtained from the outlet of the regulating unit 4. The apparatus also includes a signal coil 8, wherethrough the current or magnetic field under measurement is shifted to the ring a of the SQUID 1.

The SQUID 1 is formed of a superconducting ring a, as well as of one or two Josephson junctions, which are located at a low temperature of for instance 4.2° K. At the same temperature, there is also located the transformer 2 and the coils 5 and 8 (i.e. the components indicated by dotted lines).

Figure 2:
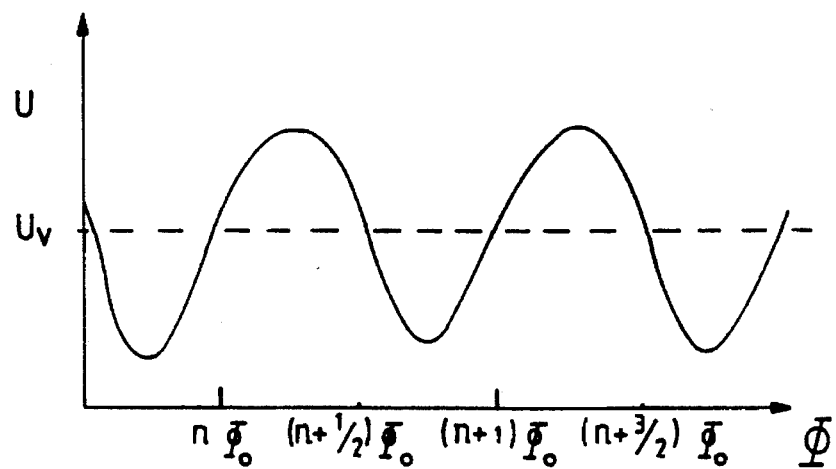
FIG. 2 is an illustration of the dependence of the output voltage of the SQUID sensor on the incoming magnetic flux in the system of FIG. 1.

In this case the ring a comprises two Josephson junctions, b and c. Now the sensor is called a dc SQUID. This kind of sensor transforms the flux $\Phi$ of the magnetic field passing through the superconducting ring to the voltage U. A typical outlet voltage U of a SQUID, as the function of the flux $\Phi$, is cyclic according to FIG. 2, and contains a standard element $U_v$, which is dependent on the critical current of the Josephson junctions. The length of the cycle is one flux quantum $\Phi°=2,05\times10^{-15}$ Wb.

In connection with the SQUID sensor 1, there is employed a modulator 4, i.e. a so-called flux modulator, and a cold-operated transformer 2, for adjusting the low impedance of the SQUID for the FET preamplifier 3. Within the frequency range of about 1 kHz–100 kHz, the noise temperature of Field Effect Transistors, i.e. FET amplifiers, is extremely low.

In the flux modulator 4, the amplitude having the shape of a rectangular wave is adjusted to correspond to half of the cycle of the response (see FIG. 2); for each cycle $\Phi$, there are thus provided two operating points, so that the flux modulation does not cause voltage fluctuation in the SQUID outlet. If, however, the external flux shifts the operating point, the rectangular wave appears over the SQUID and is amplified in the amplifier 3 located next to the transformer 2. The regulating unit 4 returns the flux back to zero by feeding the required corrective current to the coil 5 provided in connection with the SQUID.

Figure 3:
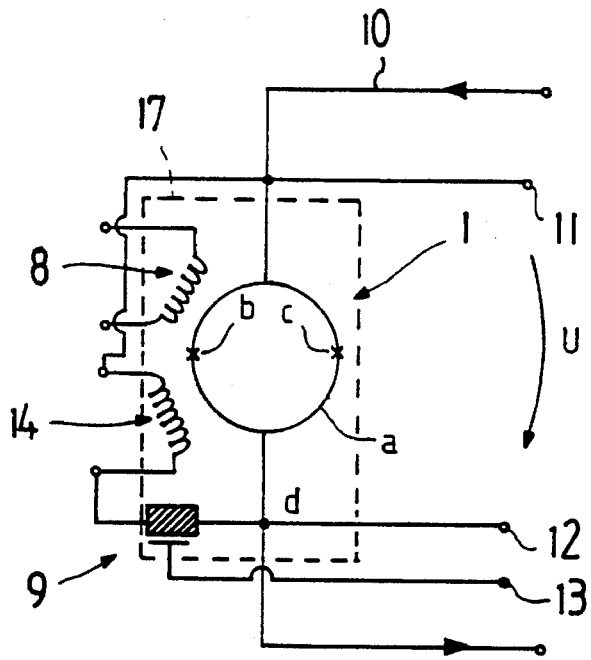
FIG. 3 is a schematical illustration of the apparatus of the invention for providing positive adaptive feedback in connection with the SQUID sensor.
Figure 4:
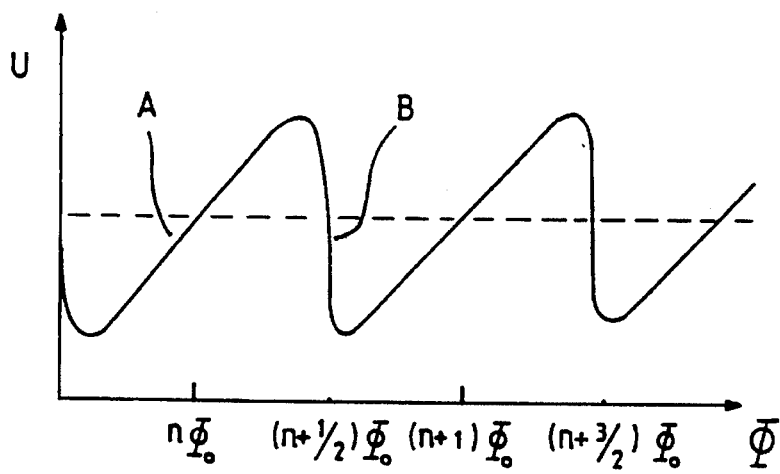
FIG. 4 illustrates the dependence of the output voltage of the SQUID sensor on the incoming magnetic flux in the system of FIG. 3.

FIG. 3 is a schematical illustration of an apparatus of the invention. The SQUID 1 is composed of a superconducting ring a and Josephson junctions b, c. The outlet d of the SQUID is coupled back to the inlet, i.e. to the feedback coil 14 via an adjustable resistor 9. The current or magnetic field under measurement is brought to the SQUID ring via a signal coil 8. All components of the apparatus, i.e. the SQUID 1, the feedback coil 14, the signal coil 8 and the adjustable resistor, are arranged in a suitable vessel, such as a dewar 17, at a low temperature, for instance 4.2° K. It is essential that at least the adjustable resistor 9 is at a low temperature together with the SQUID. Generally the SQUID is biased by introducing current via the wire 10. The measurement is carried out by measuring the outlet voltage U of the SQUID in between the outlet poles 11 and 12.

According to FIG. 3, the feedback of FIG. 3 results in that the dependence of the outlet voltage U of the SQUID on the magnetic flux $\Phi$ under measurement becomes asymmetrical; every second cycle is a gentle A, i.e. an area of negative feedback, and every second cycle is a steep B, i.e. an area of positive feedback.

In FIG. 3, the adjustable resistor 9 is realized so that its rate can be adjusted by means of the voltage fed in via the wire 13. The resistor rate is adjusted by operating from the room temperature, in which case the increase in the amplification, caused by positive feedback, can in principle be adjusted near to infinite. Thus, in spite of the parameter fluctuations of the SQUID, an effective amplification is achieved owing to positive adaptive feedback.

Along with the increase in the amplification, the outlet noise also is increased. With a weak amplification, the noise is determined from the noise of the amplifier next in succession after the SQUID. When the amplification is sufficiently increased, most advantageously multiplied by 5–20, the noise is determined from the noise of the SQUID, and the effective outlet noise of the amplifier is increased.

One solution to accomplish the adjusting system for the resistor 9, according to the apparatus of FIG. 3, is as follows. The outlet noise apparent outside the measuring band, particularly above it, is detected at a suitable frequency or frequency band, such as 10 kHz–100 kHz. A rating is set for this noise. The rate of the adjustable resistor 9 is increased, until the output noise reaches the said rating. The regulating unit locks the amplification of the preamplifier, so that the said noise level is attained. Thus it is possible automatically to supervise that the total amplification of the output signal from the SQUID is sufficient, so that the preamplifier operated at room temperature should not remarkably add to the SQUID noise. The reading of the adjustable resistor can only be set at the beginning of the measurement, if the SQUID parameters can be supposed to remain constant at an adequate accuracy.

The apparatus described above in FIG. 3 also comprises a preamplifier and a regulating unit which are not illustrated in the drawing. This embodiment will be referred to later on. The amplified output signal of the SQUID is brought back to the SQUID input via the regulating unit in order to create a negative countercoupling. The final measurement is realized so that in the particular frequency or frequency range where noise is being measured, negative feedback is not effective, at least to any noticeable degree.

The second solution for realizing the adjusting system for the resistor 9 in the apparatus of FIG. 3 is as follows. In the SQUID there is fed an ac-current signal with a suitable frequency, advantageously a sinusoidal signal. The frequency of this type of signal may fluctuate within the range 10 kHz–10 MHz. This is amplified in a preamplifier, and compared to a predetermined signal rate. The amplitude or other corresponding value of the ac-current signal is again adjusted by changing the rate of the resistor 9 in the output of the preamplifier to correspond to the predetermined signal rate.

In principle this method corresponds to the above described method based on measuring noise. The application of this method requires the adding of a separate oscillator to the processor of the output signal of the SQUID. This method can be advantageously applied in cases where several SQUIDs are employed simultaneously; one oscillator or ac-current generator can feed several SQUIDs.

According to the invention, an essential element in adaptive positive feedback is the adjustable resistor 9. Most advantageously it is realized by using a channel transistor operated at low temperatures, such as a GaAs JFET or MESFET, a silicon-based MOSFET or HEMT based on a quantum trap. The through resistance of the channel transistor is easily adjusted by adjusting the grid voltage. The GaAs JFET was tested in the apparatus of the invention for increasing the SQUID amplification, and it was found out that the system noise can be made dependent only on the noise of the SQUID.

One possibility to realize an adjustable resistor is to use highly temperature-dependent resistor material and to adjust the resistor temperature by means of current. A suitable semiconductor is well applicable to this purpose. The transition taking place in superconductors at certain temperatures can also be utilized for realizing an adjustable resistor. An adjustable resistor is also created by illuminating a piece made of a superconductor or a resistor made of a semiconductor. A thin wire made of a superconductor can even be integrated as a permanent component of a SQUID circuit. The use of light or infrared radiation in adjusting a resistor made of a superconductor is based on the fact that the Cooper pairs, of which the superconductor is composed, can be broken up by means of light. The strength of the radiation determines the number of pairs eliminated per time unit, and consequently also the effective resistivity of the "superconductor". It is also possible to use a silicon base in making the semiconductor resistor, which can then be employed as a light-sensitive resistor. Along a light fiber, light or long-wave radiation can easily be transported to a resistor arranged in a dewar.

The above described adaptive positive feedback can be applied together with flux modulation techniques. If the output voltage of the SQUID is measured directly without flux modulations, the output voltage is also dependent on the fluctuations of the critical currents of the Josephson junctions, as well as on their temperature dependencies. The temperature dependency can be simply eliminated by providing in the vicinity of the SQUID a temperature-dependent resistor, and by adjusting a voltage thereupon, so that the current, while passing through the feedback coil, cancels the effect of the temperature dependence of the SQUID on the result of measurement. The employed temperature-dependent resistor can be for instance a resistor made of some semiconductor material. Generally SQUIDs are manufactured on a silicon base, wherefore the temperature-dependent resistor can also be realized by integrating it in the same base with the SQUID.

SQUID sensors are used in magnetometers. In current magnetometer applications, negative feedback is realized by transporting and connecting the wires from room temperature, from the outlet of the preamplifier, back to a low-temperature SQUID, and particularly to the coil coupling the magnetic field connected thereto. FIG. 1 is referred to.

Figure 5:
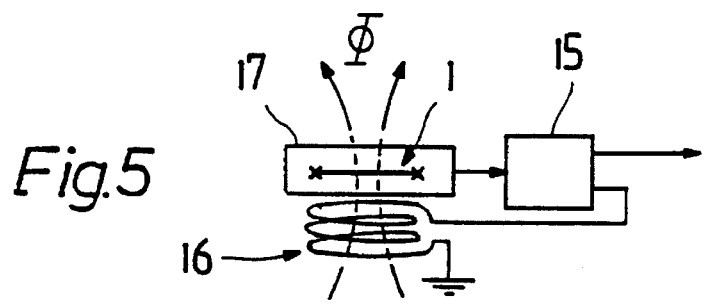
FIG. 5 is a schematical illustration of how to arrange negative feedback via an external coil to the SQUID sensor.
Figure 6:
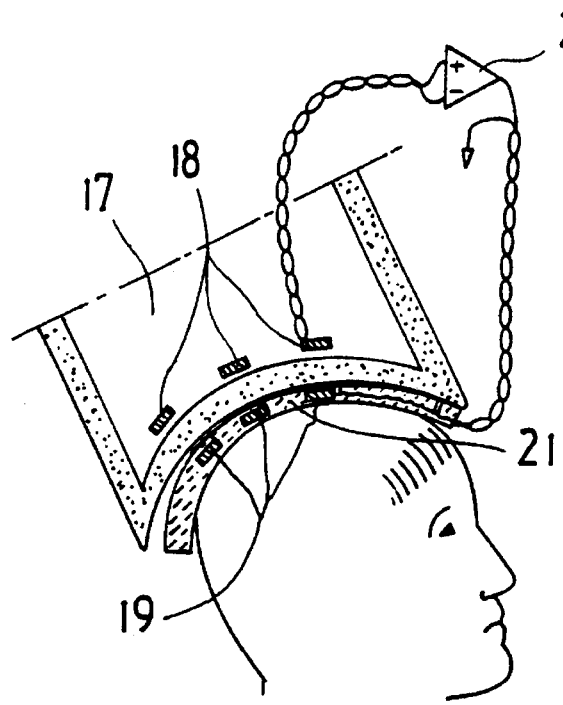
FIG. 6 illustrates how the system of FIG. 5 is applied to a multichannel magnetometer.

According to the invention, negative feedback can also be realized from outside the SQUID, and from room temperature, as is illustrated in FIGS. 5 and 6.

In the embodiment of FIG. 5, the outlet ot the SQUID 1, located in a dewar 17 or other corresponding cooled vessel, is connected to a room-temperature amplifier and to a possible regulating unit 15. The outlet of the amplifier 15 is connected to a coil 16 located at room temperature, which coil is arranged in the immediate vicinity of the SQUID, so that the feedback from the coil 16, through the magnetic field created therein and through the flux $\Phi$ passing through the ring of the SQUID, to the SQUID is attained.

FIG. 6 is a schematical illustration of a multichannel magnetometer particularly desinged for the magnetic measurements of the brain. The magnetometer comprises a cooled vessel, such as a dewar 17, wherein, at a low temperature, there is provided a number of individual magnetometers, i.e. SQUID sensors 18. Below the dewar 17, for instance attached to the bottom surface thereof, there is supplied a number of coils 19, which exist at room temperature. They are placed at the separate SQUIDs 18. By feeding the output signal of each SQUID 18 from the amplifier 20 back to the SQUID via the respective coil 19, the magnetic field affecting the SQUID can be neutralized.

If the above described procedure is followed with every single magnetometer, i.e. channel, outside the dewar 17 there is created, by means of the coils 19, a number of current dipoles which neutralize the magnetic field in all SQUIDs 18. This kind of feedback remains stabile, although the external coil 19 with its stray fields should somewhat affect other nearby SQUIDs. If, however, the feedback is unstable as regards the adjusting technique, a feedback from each SQUID can easily be arranged both to nearest dipole source and to other nearby dipole sources. By suitably choosing the feedback amplifications, problems arising from such cross-coupling can be eliminated.

When the coils 19, i.e. the group of dipole sources, are attached to the dome 21, which can be fitted for instance in the head of the patient, the position of the current dipole arranged in the patient's brain can be located, because the dipole sources provided in the "cap", i.e. the hood 21, are easily located in relation to the patient. If this procedure is followed, attention must be paid to make the "cap" remain relatively accurately in its proper place with respect to the SQUID sensors 18 arranged in the dewar 17. This ensures that the feedback remains stable.

The feedback procedure described above in connection with FIGS. 5 and 6 can be applied, apart from a magnetometer, also to a gradiometer. In connection with a magnetometer, the gradient can be measured for example by subtracting the currents of two adjacent current dipoles, i.e. coils 19 (cf FIG. 6). By using the subtraction technique, gradiometers of a higher order can also be easily constructed.

Figure 7:
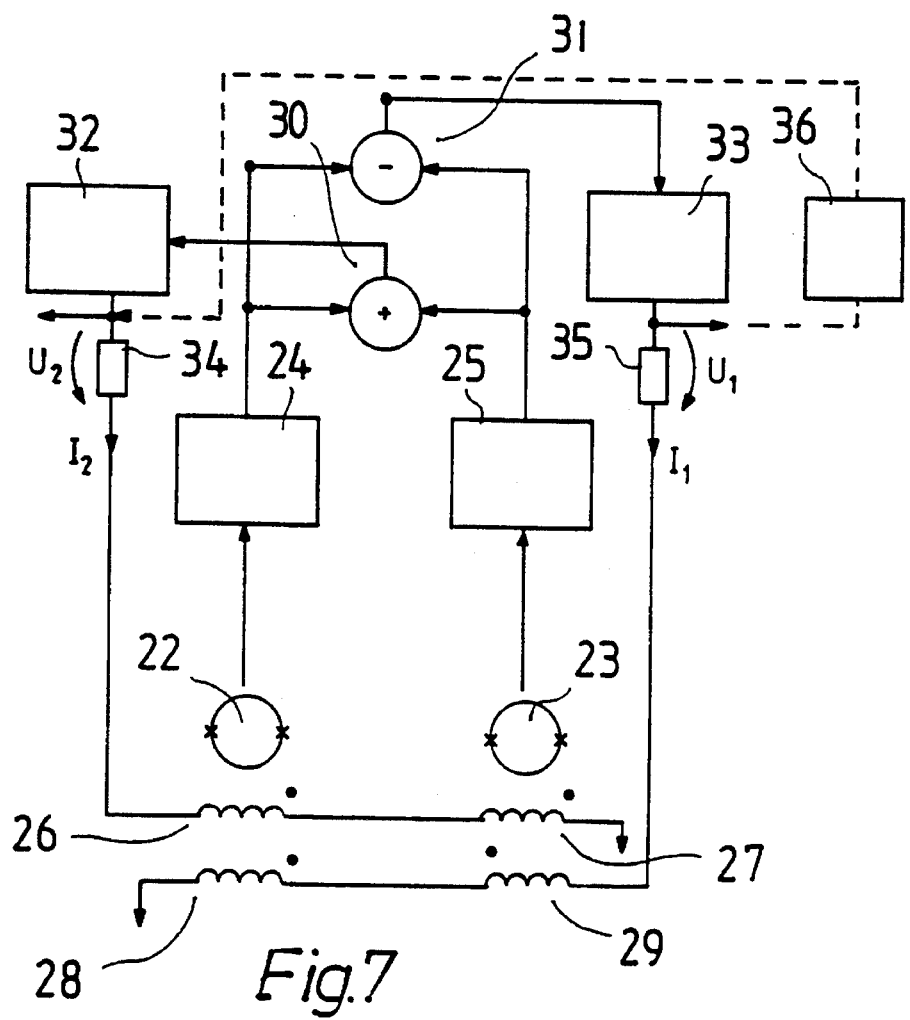
FIG. 7 is a schematical illustration of how a magnetometer and/or gradiometer is realized, according to the invention, by means of a pair of SQUIDs.

Negative feedback can also be realized by using the arrangement illustrated in FIG. 7. This feedback is particularly suited to a gradiometer with a relatively long base. This type of gradiometer has an extremely high resolution. When the methods and apparatuses for processing SQUID outlet signals specified in this application are applied for instance to magnetometers and gradiometers, extremely large dynamics are attained for the created apparatus; the differences between the smallest and largest quantity are most advantageously in the range of $10^8$.

It is well known that by employing modern production techniques for manufacturing SQUIDs, the rings serving as antennas can be produced in standard size, with the inaccuracy of a few micrometers. Although there should be slight differences in the rings, the size of the loop as a function of time remains strictly standard. Thus it is possible to manufacture at least one pair of SQUIDs with essentially similar SQUIDs.

The apparatus of FIG. 7 for measuring the strength and/or gradient of a magnetic field comprises two SQUIDs 22, 23, i.e. a pair of SQUIDs, their preamplifiers 24, 25 and the first feedback coils 26, 27 provided in the vicinity of the SQUIDs, and the second feedback coils 28, 29. The apparatus also comprises a summing member 30 and a first regulating unit 32, as well as a subtracting or discriminating member 31 and second regulating unit 33. The outlets of the preamplifiers 24, 25 are connected, via the summing member 30 and the first regulating unit 32, in same directions to the first coils 26, 27 of both SQUIDs 22, 23, which coils are coupled in series. The outlets of the preamplifiers 24, 25 are also connected, via the subtracting member 31 and the second regulating unit 33, in opposite directions, to the second coils 28, 29 of both SQUIDs 22, 23, which coils are coupled in series. In connection with the first coils 26, 27, and the second coils 28, 29, there are also coupled resistors 34, 45 respectively.

In the apparatus of FIG. 7, the sum of the amplified output signals from the two SQUIDs 22, 23, is fed back to the first feedback coils 26, 27 of each SQUID, parallelly so that the output signals from both SQUIDs are decreased. In other words, the sum signal from the measurements has a negative countercoupling, via the magnetic flux, back to the input of the SQUIDs. On the other hand, the subtraction of the amplified output signals is fed back via the second set of coils 28, 29, so that the output signal of the first SQUID 22 is decreased, and the output signal of the second SQUID 23 grows. In other words, the difference of the measurements has a negative countercoupling, via the magnetic fluxes, back to the input of the SQUIDs.

When the system of FIG. 7 is in balance, the gradient is obtained simply by measuring the current $I_1$ fed in the second set of coils 28, 29, which current creates the fluxes in the SQUIDs 22, 23 in opposite directions. The rate of the magnetic field is obtained by measuring the current $I_2$ fed in the first set of coils 26, 27.

The mutual inductances in between the SQUIDs 22, 23 may somewhat deviate from each other. In order to compensate these deviations, the apparatus comprises a corrective circuit 36, which in FIG. 7 is connected in between the feedback circuits, so that a small part of the voltage comparable to the magnetic field, such as the voltage $U_1$ influential over the resistor 34, is summed to a voltage comparable to the gradient of the magnetic field, such as the voltage $U_2$ influential over the resistor 35.

By following the principles of the apparatus of FIG. 7, a very well balanced gradiometer can be realized, because the structures of the SQUIDs are extremely stabile, and because there is little need for electronic corrections. This type of gradiometer does not have to be electrically tuned but for once. Another advantage of this embodiment also is that by using the same arrangement, both the magnetic field and the gradient can be measured. By adjusting the area of the coils and the mutual distance of the SQUIDs, the sensitivity of the magnetometer on one hand and the sensitivity of the gradiometer on the other can be separately adjusted. Consequently suitable gradiometers and magnetometers can be constructed for different applications, such as geomagnetic measurements.

Figure 8:
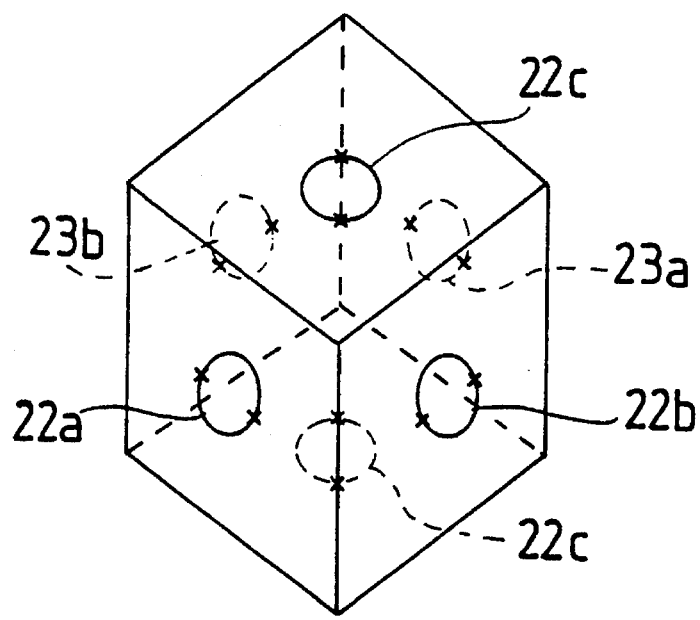
FIG. 8 is a schematical illustration of an apparatus for measuring a magnetic field and the gradients of a magnetic field.

By following the principles of the apparatus of FIG. 7, there can be realized an apparatus for measuring the strength and/or gradient of a magnetic field in three spatial dimensions. In this embodiment, three pairs of SQUID sensors 22a, 23a; 22b, 23b; 22c, 23c are coupled on opposite sides of a cube, as is illustrated in FIG. 8. Each pair of SQUIDs is in turn provided with the output signal processor of FIG. 7.

By means of this arrangement, the rates of the magnetic field and the gradients can be measured in three spatial directions. This amount of measurements is sufficient for completely characterizing the magnetic field. The arrangement is particularly well suited for geologic surveys in measuring magnetic fields. It is pointed out that in the cube arrangement, the location of the SQUIDs is not very critical. Moreover, it suffices if the planes of opposing surfaces remain in place with respect to each other, as a function of time and temperature.

Figure 9:
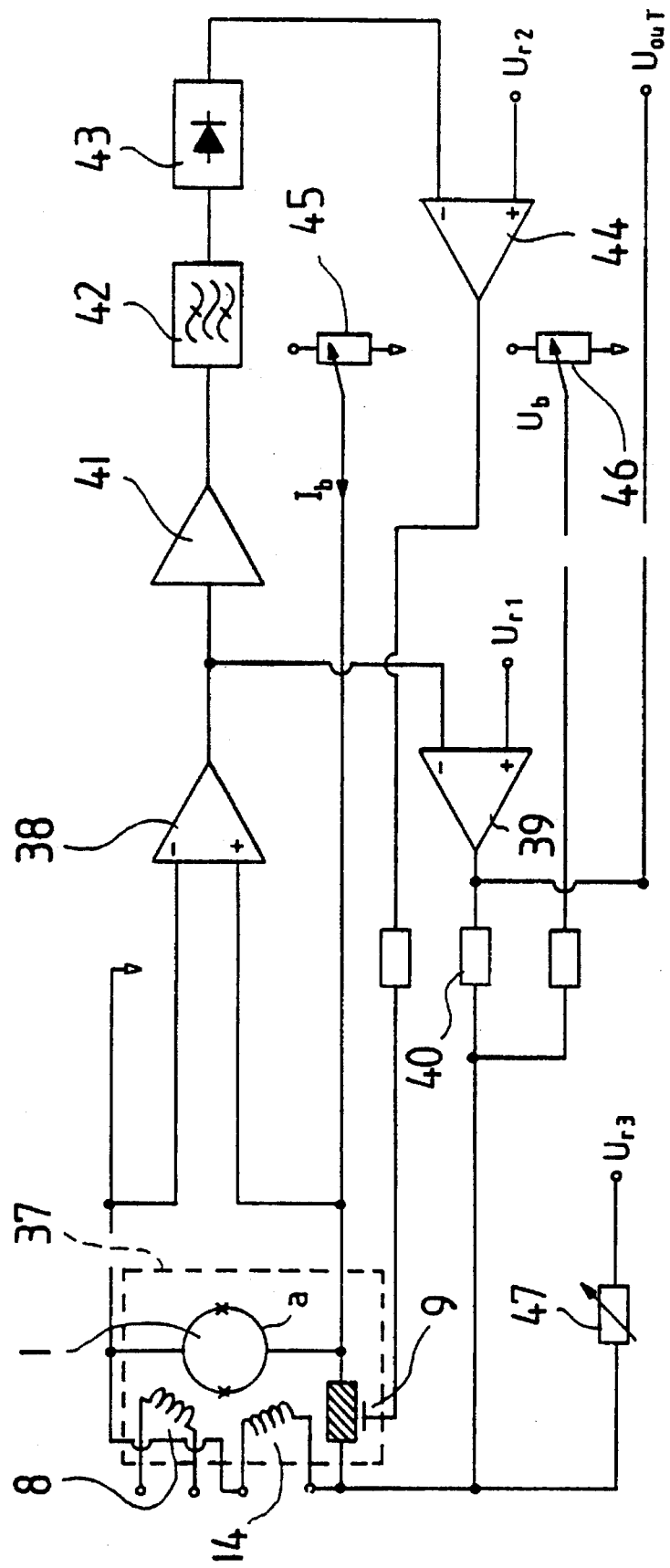
FIG. 9 is a schematical illustration of an apparatus where the rate of the feedback resistor is adjusted by means of noise.

FIG. 9 incorporates a block diagram of an apparatus of the invention. In this apparatus, positive feedback is applied in order to increase the amplification of the output voltage of the SQUID, and the adaptive adjusting of the feedback is realized by observing the strength of the noise signal. In addition to this, in this apparatus the temperature dependence of the Josephson junctions of the SQUID is neutralized by means of a temperature-dependent resistor.

The apparatus of FIG. 9 comprises a SQUID sensor 1, a signal coil 8, an adjustable resistor 9 and a feedback coil 14, which are arranged at a low temperature in a dewar 37 or equivalent. The signal coil and the feedback coil are located in the immediate vicinity of the ring a of the SQUID 1. Through the signal coil 8, the current or magnetic field under measurement is shifted to the superconducting ring a of the SQUID. The adjustable resistor 9 is coupled in between the SQUID output and the feedback coil 14 in order to create positive feedback.

The apparatus also comprises a small-size preamplifier 38, a regulating unit 39 and a feedback resistor 40 existing at room temperature. The output signal from the SQUID 1 is amplified in the preamplifier 38, whereafter the amplified output signal is compared to the reference voltage $U_{r1}$, and the voltage difference is coupled, via the regulating unit 39, such as a PI regulating unit, and feedback resistor 40, to the feedback coil 14 and further to the SQUID in order to create negative feedback. The measuring signal $U_{out}$ is taken out of the output of the regulating unit 39.

The apparatus further comprises an amplifier 41, a filter 42, advantageously a band-pass filter, a detector 43 and a regulating unit 44, advantageously a PI regulating unit, which are coupled to each other and further to the adjustable resistor 9. For detecting noise or other adjusting signals, the output signal from the SQUID is brought, after the preamplifier 38, via the amplifier 41 and the band-pass filter 42, to the detector 43. The output voltage of the detector 43 is compared to the reference voltage $U_{r2}$, and the offset voltage is brought, via the regulating unit 44, to the adjustable resistor 9. The reference voltage $U_{r2}$ represents a reference rate for the noise signal, which reference rate is attempted to be attained. On the basis of the subtraction of the noise signal and the reference rate, i.e. on the basis of the voltage difference, the resistor rate of the adjustable resistor 9 is set so that this predetermined reference rate is achieved.

The operating point of the SQUID 1 is set by means of the adjustable resistors 45 and 46. The resistor 45 is used for setting the bias current $I_b$, and the resistor 46 for setting the bias voltage $U_b$ to be suitable. The voltage $U_{r3}$ is coupled, via the temperature-dependent resistor 47, to the feedback coil 14 of the SQUID 1. When correctly tuned, the output signal of the SQUID is linearly dependent on the input current, i.e. on the incoming signal under measurement, and its noise level is determined on the basis of the noise of the SQUID itself. If also the resistor 47 adjustable according to the external temperature, and/or the voltage $U_{r3}$ are correctly chosen, the output signal is independent of the fluctuations and operating temperatures of the critical currents of the Josephson junctions in the SQUID.

Another way to eliminate the fluctuation and temperature dependency of the critical currents of the Josephson junctions is to modulate the bias current $I_b$ or the bias voltage $U_b$ at a high frequency. Simultaneously the magnetic flux $\Phi$ must be shifted for half a cycle. By measuring the average output voltage of the SQUID, it is observed that it is a flux-dependent sinusoidal voltage with an average of zero, if the current/voltage characteristic of the SQUID is symmetrical.

Figure 10:
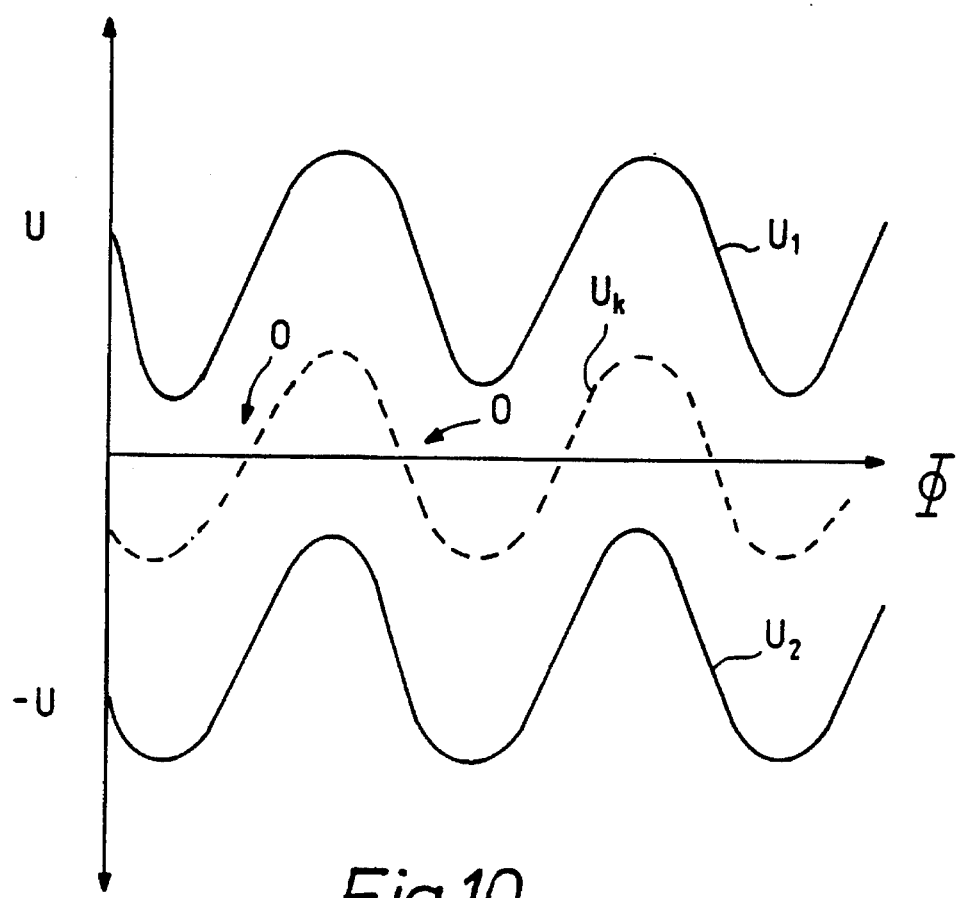
FIG. 10 illustrates how the output voltage of the SQUID sensor is dependent on the strength of the external magnetic flux, when the bias current is modulated at a high frequency.

FIG. 10 represents an illustration of the output voltage U of the SQUID as a function of the external magnetic flux $\Phi$. When the bias current $I_b$ of the SQUID is modulated, the output of the SQUID jumps between two alternating voltages $U_1$ and $U_2$. Simultaneously and synchronically with the modulation of the current $I_b$, the flux $\Phi$ is shifted for half a cycle, in which case the average voltage $U_k$ is made nearly sinusoidally dependent on the external flux $\Phi$. Because the zero points 0 of the average voltage $U_k$ are independent of the amplitude and average voltage of the original response, the zero point is not dependent on temperature either. If the SQUID is locked at one zero point, the output signal of the SQUID is made independent of the temperature, and on the time dependence of the parameters of the SQUID.

Figure 11:
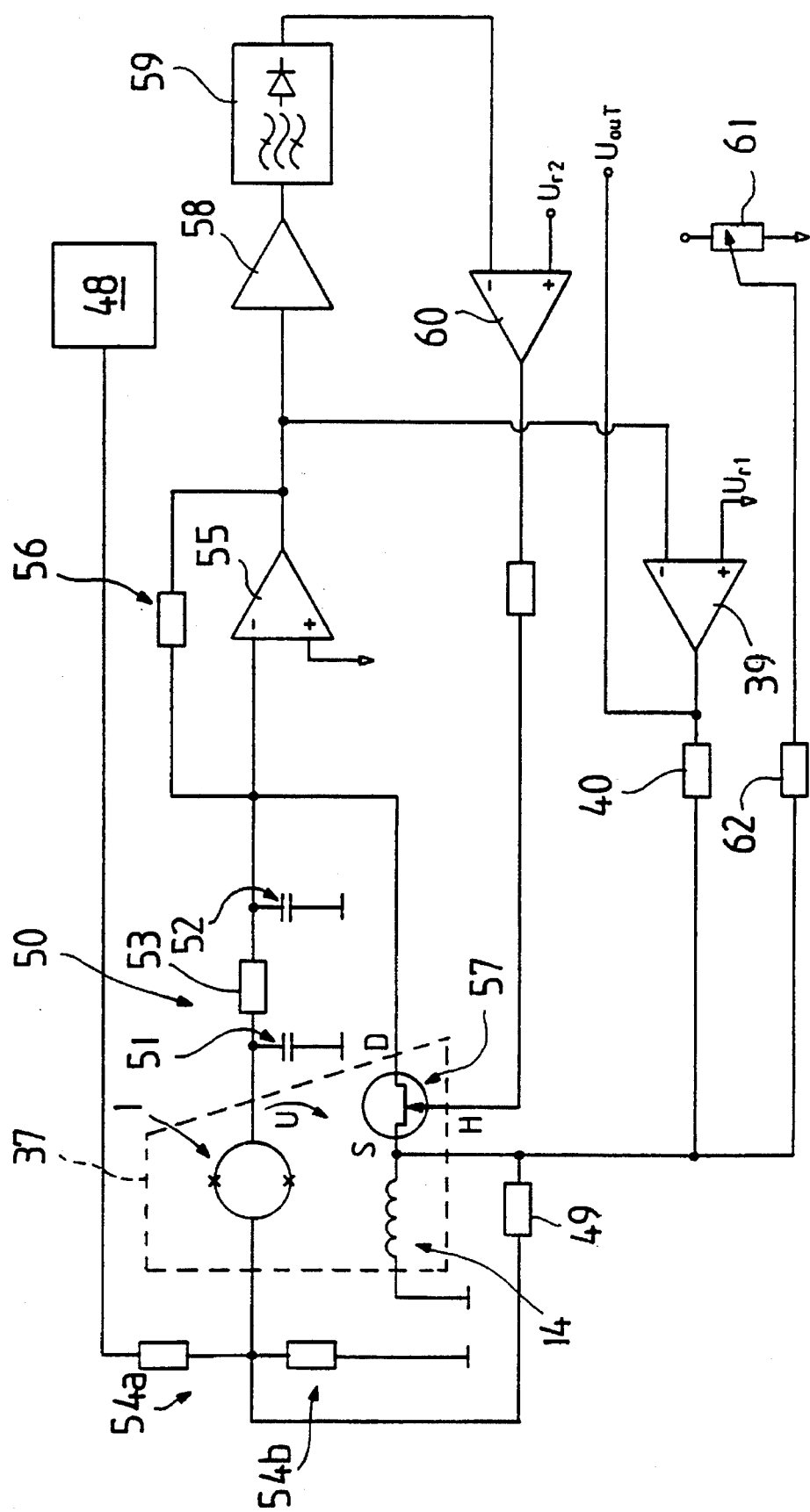
FIG. 11 is a schematical illustration of an apparatus of the invention, where the temperature dependence of the SQUID sensor can be compensated in two different ways.

FIG. 11 represents, in block diagram, another apparatus of the invention. The SQUID 1, the feedback coil 14 and the adjustable resistor 57 are arranged in a vessel 37, which is cooled down to a low temperature. The apparatus is provided with adaptive positive feedback and negative feedback. In this apparatus, the temperature dependence of the SQUID 1 can be compensated in two alternative ways, which are described below.

The biasing of the SQUID 1 is realized by means of a voltage source which in the first application is a dc-voltage source 48. The dc-voltage is brought, via a resistance distributor 54a, 54b, to the SQUID, and further via the resistor 49, back to the feedback coil 14. The temperature dependence of the SQUID is compensated by means of the resistor 49 adjustable according to the temperature, in similar fashion as in the embodiment of FIG. 9.

The biasing of the SQUID 1 is realized by means of a voltage source 48, which in the second application is an ac-voltage source, i.e. the biasing voltage is modulated. The necessary flux shift is carried out by means of the resistor 49, which in this case is a resistor independent of temperature. The resistor 49 is chosen so that the change of the biasing voltage from positive to negative causes the magnetic flux to shift half a cycle in the SQUID response. While employing ac-voltage in the biasing, the SQUID 1 is followed by a filter 50, whereby the influence of the biasing on the output signal U is filtered. Among others, the filter 50 comprises condensators 51, 52 and a resistor 53.

It is pointed out that the apparatus operates in similar fashion irrespective of the fact whether the bias voltage of the SQUID is modulated or not. The output voltage U of the SQUID contains an ac-voltage component, in case the bias voltage is realized by means of ac-voltage. This ac-voltage component is removed by means of a low-pass filter. The modulating frequency of the bias voltage is remarkably higher than the top limit frequency of the filter 50 set for the SQUID input.

In the apparatus of FIG. 11, the output signal of the SQUID is taken in the preamplifier 55, and fed back to the SQUID via the resistor 56. Because with low frequencies the amplification of the operational amplifier serving as the preamplifier 55 is extremely high, the current passing through the feedback resistor 56 sets the input of the amplifier of the output signal U in the SQUID to be equal with the noise voltage.

The apparatus also comprises an adjustable resistor which is realized by using the FET 57. This is coupled in between the output of the SQUID, if the filter 50 is employed, and the feedback 14, in order to realize positive feedback.

The apparatus also includes an amplifier 58, a filter and detector 59 and a regulating unit 60 for adjusting the resistor of the FET 57. The output voltage of the filter and detector is compared to the reference voltage $U_{r2}$, and on the basis of the obtained difference, the rate of the adjustable resistor is set, i.e. in this case the resistor in between the S and D poles of the FET is set by adjusting the grid voltage H of the FET. The operating point of the FET is set, by means of a potentiometer 61, through a resistor 62.

The apparatus further comprises a low-noise preamplifier 38 at room temperature, a regulating unit 39 and a feedback resistor 40, exactly as in the embodiment of FIG. 9. The output signal of the SQUID 1 is amplified in the preamplifier 38, whereafter the amplified output signal is compared to the reference voltage $U_{r1}$, and the voltage difference is coupled via the regulating unit 39, such as a PI regulating unit, and the feedback resistor 40 to the feedback coil 14 and further to the SQUID in order to create negative feedback. The measuring signal $U_{out}$ is taken out of the output of the regulating unit 39.

The noise voltage of the preamplifier connected to the output of the SQUID 1 passes through the adjustable resistor, i.e. the FET 57, to the feedback coil 14. It is intensified in the SQUID, thus creating in the SQUID a voltage comparable to the amplifier noise, which by a suitable rate of the adjustable resistor cancels the influence of the noise voltage in the output of the preamplifier. It is easily proved that with the reading of the feedback resistor or adjustable resistor 57, which in the case of the coupling given in FIG. 2 creates an almost infinite amplification, the noise voltage of the amplifier is neutralized in the embodiment of FIG. 11. In FIG. 11, the response of the SQUID, when measured in the output of the preamplifier 55, corresponds to the curve $U_1$ of the drawing, without voltage modulation, and to the curve $U_k$ with voltage modulation.

A critically tuned positive feedback is expressed in that during the first half cycle, the noise is determined in the preamplifier, whereas during the second half cycle the noise is only dependent on the internal noise of the SQUID, or on the noise of the target under measurement. Owing to the negative feed-back directed to the SQUID output, the response is not dependent on positive feedback. In other words, the response corresponds to that of FIG. 10. When the amplification of the open loop of the preamplifier 55, multiplied by the additional amplification caused by the positive feedback, is decreased when the frequency grows for less than the ratio determined as the ratio of the feedback resistor 57 and the dynamic resistance of the SQUID, the noise in the output of the preamplifier in a low-noise slope depends on the noise of the preamplifier and on the noise of the SQUID multiplied by the additional amplification caused by the positive feedback. In other words, with frequencies where the amplification of the preamplifier, in this case the operational amplifier 55, is not sufficient for feeding back to the plus-input potential of the operational amplifier of the SQUID, the output of the SQUID and consequently the output of the amplifier 55 make noise as if the SQUID were read by a voltage amplifier without current feedback. In this frequency range it is advantageous to carry out a measurement of the amplification connected to the adjusting of the feedback, i.e. the rate of the resistor 57, either by making use of noise or a signal made up by means of an oscillator.

The embodiment of FIG. 11, provided with ac-current modulation of biasing, is advantageous if the voltage modulation of the SQUID is high (over 50 μV) and/or if several SQUIDs are used simultaneously. If the voltage modulation of the SQUID is high, the voltage drift of the preamplifier, i.e. the operational amplifier 55, does not essentially affect the setting of the operating point of the SQUID. On the other hand, while using voltage biasing, changes in the critical currents of the Josephson junctions do not have much effect on the amplification of the open loop of the SQUID.

As for the coupling of room-temperature electronics, the coupling of FIG. 11 resembles that of FIG. 9. While using ac-current, the output of the preamplifier 55 does not include a dc-component, wherefore the output of the amplifier can be coupled directly back via the integrating regulating unit 60, without the bias voltage $U_{r2}$ (FIG. 9). If the bias voltage is brought in the dewar by means of a separate coaxial cable, and if one symmetrical transformer is additionally placed at a low temperature, it may be possible to realize a multi-channel system with one grounded wire and four wires for each SQUID channel. Because in the coupling of FIG. 9, when using ac-current modulation, the grounded wire from the SQUID to room temperature is practically without current, disturbing couplings are not created in between the separate channels.

It can be shown that in a well-planned processor for the output signal of the SQUID, the output noise is somewhat higher than the thermal noise corresponding to the dynamic impedance of the SQUID. Thus the rate of the adjustable resistor performing the positive feedback must be of the same scale as the dynamic response of the SQUID. The dynamic response of the SQUID normally is only about 1–5 ohm, which means that the voltage noise of the SQUID at its lowest is within the range of 50 pV only. Because the noise of a good operational amplifier employed as a preamplifier is about 1 nV, the additional amplification created by positive feedback must be at least 20. Additional amplification in this scale is very difficult to realize without the adaptive positive feedback of the present invention.

The invention is not limited to the above described preferred embodiments only, but many modifications are possible within the scope of the inventional idea defined in the appended patent claims.

I claim:

1. A method for processing an output signal of a low-noise sensor, particularly a sensor based on at least one Josephson junction, such as a SQUID, comprising the steps of:

connecting an adjustable resistor between an output port and an input port of the sensor to create a positive feedback from the output port to the input port;

feeding the output signal of the low-noise sensor at the output port back to the input port of the sensor; and regulating resistance of the resistor by adjusting means so that an amplification of the sensor is set to be suitable.

2. A method according to claim 1, further comprising a step of pre-setting the amplification on a suitable level by regulating resistance of the resistor by the adjusting means, so that, whereafter, a measurement of the amplification is carried out.

3. A method according to claim 1, wherein the adjusting means provided in the regulating step includes one from adjustable voltage, adjustable current, or adjustable light.

4. An apparatus for processing an output signal of a sensor based on at least one Josephson junction, such as a SQUID, comprising:

the sensor having an input port and an output port;

an adjustable resistor being electrically connected between the output and input ports of the sensor, the output signal being positively feedbacked from the output port to the input port; and means for adjusting resistance of the resistor, the adjusting means being connected to the resistor.

5. An apparatus according to claim 4, wherein the adjustable resistor includes at least one from GaAs JFET, MESFET, a silicon-based MOSFET, or HEMT based on a quantum trap.

6. An apparatus according to claim 5, wherein the adjusting means includes at least one from adjustable voltage, adjustable current, or adjustable light.

7. An apparatus according to claim 4, wherein the adjusting means is disposed from outside the sensor.

* * * * *